(12) United States Patent
Akino

(10) Patent No.: US 8,031,899 B2
(45) Date of Patent: Oct. 4, 2011

(54) MICROPHONE

(75) Inventor: Hiroshi Akino, Machida (JP)

(73) Assignee: Kabushiki Kaisha Audio-Technica, Machida-shi (JP)

( * ) Notice: Subject to any disclaimer, the term of this patent is extended or adjusted under 35 U.S.C. 154(b) by 1470 days.

(21) Appl. No.: 11/492,079

(22) Filed: Jul. 25, 2006

(65) Prior Publication Data

US 2007/0036361 A1 Feb. 15, 2007

(30) Foreign Application Priority Data

Jul. 26, 2005 (JP) .................................. 2005-215392

(51) Int. Cl.
*H04R 25/00* (2006.01)
(52) U.S. Cl. .......................... 381/361; 381/113; 381/355
(58) Field of Classification Search .................. 381/355, 381/361, 362, 369, 92, 111, 122, 174, 189, 381/113; 439/95, 620.21
See application file for complete search history.

(56) References Cited

U.S. PATENT DOCUMENTS

| 7,558,397 B2 * | 7/2009 | Akino | 381/369 |
| 2005/0259835 A1 * | 11/2005 | Akino | 381/111 |
| 2006/0133626 A1 * | 6/2006 | Akino | 381/174 |

FOREIGN PATENT DOCUMENTS

| JP | 59-192885 | 12/1984 |
| JP | 2-45195 | 2/1990 |
| JP | 8-130387 | 5/1996 |
| JP | 2002-216464 | 8/2002 |
| JP | 2005-86231 | 3/2005 |
| JP | 2005-94575 | 4/2005 |

* cited by examiner

*Primary Examiner* — Huyen D Le
(74) *Attorney, Agent, or Firm* — Oblon, Spivak, McClelland, Maier & Neustadt, L.L.P.

(57) ABSTRACT

A microphone in which a core of an output transformer can be grounded without soldering and degradation of magnetic properties of the core can be prevented by preventing mechanical damage to the output transformer even if an impact force of the microphone is applied is obtained. A grounding pattern is formed in an output transformer mounting location of a circuit board incorporated in the microphone, a conductive fabric is put on the grounding pattern, a core of the output transformer is stacked and arranged on the conductive fabric, and the core of the output transformer is grounded through the conductive fabric. A second conductive fabric that covers the output transformer and is in contact with an inner circumferential surface of a microphone case may be provided and the microphone case may be grounded by bringing the second conductive fabric into contact with the core of the output transformer.

2 Claims, 6 Drawing Sheets

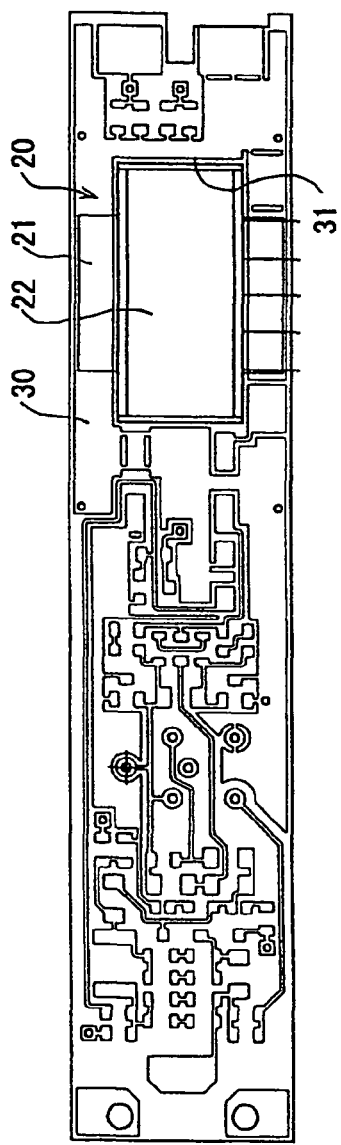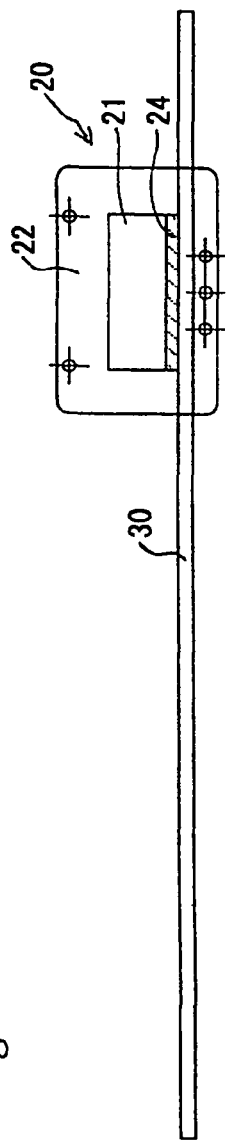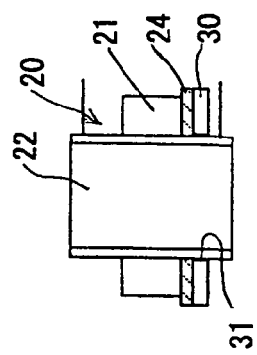
Fig. 1A
Fig. 1B
Fig. 1C (RELATED ART)

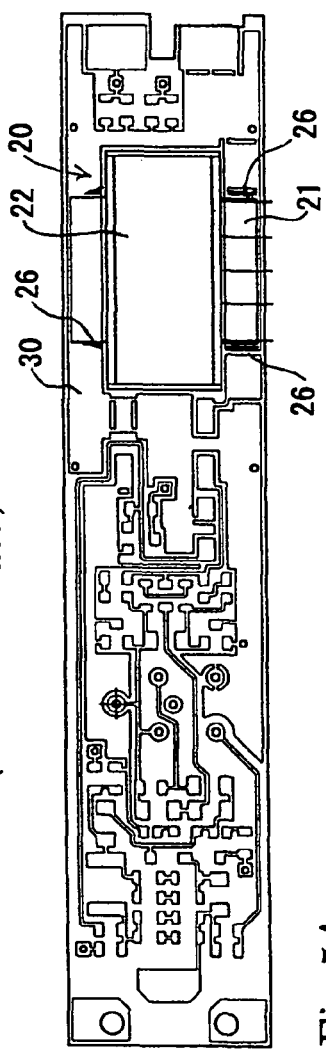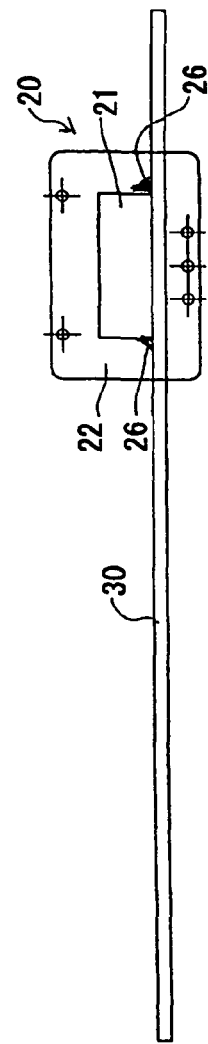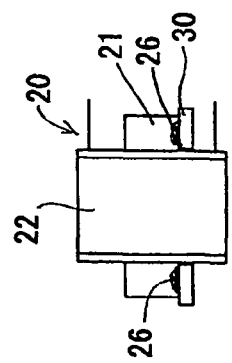
Fig.5A (RELATED ART)
Fig.5B
Fig.5C (RELATED ART)

MICROPHONE

BACKGROUND OF THE INVENTION

1. Field of the Invention

The present invention relates to a microphone and, more particularly, to a grounding structure of an output transformer thereof.

2. Related Background of the Invention

Since a signal level of signal output of a microphone is low, a balance signal is used for output. For a conversion into a balance signal output, an output transformer with a center tap is used in most cases. Since a smaller output transformer of a microphone is preferable if possible, high-permeability material is used as a core material. Examples of high-permeability material include a permalloy. A core board made of high-permeability material such as the permalloy is heat-treated so that magnetic properties are in best conditions, and then the core boards are stacked to produce a core and the core is wire-wound to assemble a transformer. Magnetic properties of the core of a transformer made of high-permeability material, typically permalloy, deteriorate when heated. Also, the core, if deformed or impacted, has a propensity that magnetic properties thereof deteriorate under an influence of an internal stress or the like.

If a core of an output transformer of a microphone is grounded while the output transformer is incorporated in the microphone, external noise can be made to escape to a ground and mixing of noise with a sound signal converted by the microphone can be prevented. It is true, however, that some low-priced microphones do not have a grounded core of an output transformer, and in such microphones, noise may be mixed with a sound signal under the influence of external noise.

An internal structure of a general microphone, particularly a structure of an output transformer portion will be described below with reference to FIGS. 3A to 3C and subsequent figures. In FIGS. 3A to 3C, the microphone has, roughly speaking, a microphone case 50, a microphone unit 10 incorporated in a front end (left end in FIGS. 3A to 3C) of the microphone case 50, a circuit board 30 disposed inside the microphone case 50, an output transformer 20 disposed adjacent to a rear end of the circuit board 30, and a connector 40 disposed by connecting to the rear end of the circuit board 30 in a rear end of the microphone case 50. A form of the microphone unit 10 is not specifically limited and the example shown is a condenser type microphone. The connector 40 is a standardized 3-pin type connector and has three pins 41.

The output transformer 20 is mounted on the circuit board 30 and an end of a primary coil and that of a secondary coil are electrically connected to a predetermined circuit pattern by soldering or the like. FIGS. 4A to 4C show an appearance of the output transformer 20, and FIG. 4A is a plan view, FIG. 4B is a front view, and FIG. 4C is a right side view. In FIG. 4A, FIG. 4B, and FIG. 4C, the output transformer 20 has a core 21 and a coil 22 wound around the core 21. The core 21 comprises, for example, a U-shaped core board and an I-shaped core board that is stacked on an open end of the U-shaped core board to connect the open end. By inverting an orientation of the open end of the U-shaped core board and a position of the I-shaped core board alternately, that is, by stacking while turning around by 180 degrees alternately on a plane parallel to a core surface, the core 21 is formed as a rectangular frame. The coil 22 consists of a primary coil and a secondary coil, and the output transformer 20 is constructed by winding each coil around a bobbin and assembling each bobbin in a way in which one bobbin is inserted into one side of the rectangular frame and the other bobbin into the opposite side. To make a signal output of the microphone a balance output, the secondary coil of the output transformer 20 is a coil with a center tap.

As described above, the core 21 of the output transformer 20 is grounded to avoid influences of external noise. The core 21 can be grounded by electrically connecting it to a grounding pattern of the circuit board 30. FIG. 5A, FIG. 5B, and FIG. 5C show an example thereof. This is an example in which a grounding pattern is formed on the circuit board 30 in a position opposite to and in contact with the core 21 of the output transformer 20 and the core 21 is soldered to the grounding pattern while the output transformer 20 is put on the circuit board 30 to fix the output transformer 20. In FIG. 5A, FIG. 5B, and FIG. 5C, reference numeral 26 denotes solder for the grounding.

However, like the example shown in FIG. 5A, FIG. 5B, and FIG. 5C, soldering of the core 21 of the output transformer 20 directly to the grounding pattern is not preferable. This is because heating of the core 21 during soldering causes a temperature to rise, leading to degradation of magnetic properties of the core 21.

Another conventional example in which the core 21 of the output transformer 20 is grounded is shown in FIG. 6. In this example, a thin metal plate 27 to which a lead wire 28 is soldered on one end thereof is used. The metal plate 27 is inserted between core boards constituting the core 21 of the output transformer 20 disposed and fixed at a predetermined position of the circuit board 30 so that electricity is conducted between the core 21 and the metal plate 27, and the lead wire 28 is soldered to a grounding pattern of the circuit board 30 to electrically connect the core 21 to the grounding pattern. Since, excluding this grounding structure, the structure is the same as that of the conventional example shown in FIG. 5A, FIG. 5B, and FIG. 5C, a description thereof is omitted.

Since, according to the conventional example shown in FIG. 6, the thin metal plate 27 is inserted between core boards, a stress (internal stress) is disadvantageously applied to the core boards constituting the core 21, leading to degradation of magnetic properties.

In still another conventional example of grounding the core 21 of the output transformer 20, the core 21 is tightened with a bare conductive wire when fixing the output transformer 20 to the circuit board 30 and the grounding occurs through the conductive wire. However, this grounding structure also has disadvantages that a stress is applied to the core boards by a tightening force of the conductive wire, and when an impact force is applied to a microphone, the impact force is also applied to the output transformer through the conductive wire to add mechanical damage, leading to change of magnetic properties.

Incidentally, as a conventional technology relating to the present invention, an output connector of a microphone equipped with a base made of an electrical insulator mounted at a rear end of a microphone grip of a condenser microphone, wherein a grounding pin and two signal pins on a hot side and a cold side are provided on the base by passing through it and the grounding pin is connected to the microphone grip via predetermined conducting means, characterized in that at least a top face and a circumferential surface of the base are covered with an electrostatic shield member that is non-conducting to each of the signal pins and conducting to the grounding pin is known (See Patent document 1).

Also, a microphone apparatus is known, wherein a sound collecting pore is provided in a cabinet of the microphone apparatus, a microphone is fixed in the microphone apparatus on a central axis of the sound collecting pore, a conductive net using a conductive material is provided between the sound collecting pore and a sound input surface of the microphone, the cabinet is blocked from the outside by filling the sound collecting pore with the conductive net, and the conductive net is grounded so that, when an object charged with static electricity approaches the sound collecting pore, static electricity discharged from the object is grounded through the conductive net (See Patent document 2).

[Patent document 1] Japanese Patent Application Laid-Open No. 2005-94575

[Patent document 2] Japanese Patent Application Laid-Open No. 2005-86231

An invention described in Patent document 1 is related to a grounding structure between a microphone grip and a grounding pin of an output connector, and an invention described in Patent document 2 is related to a structure in which a sound collecting pore of a microphone is covered with a conductive net and the conductive net is grounded. No patent document that has disclosed an installation structure of an output transformer of a microphone like the present invention could be found.

SUMMARY OF THE INVENTION

The present invention has been developed to solve the above-described problems of the conventional technologies and has an object to provide a microphone in which a core of an output transformer can be grounded without soldering, that is, without adding heat, and even if an impact force of a microphone is applied, no mechanical damage is caused to the output transformer so that degradation of magnetic properties of the core can be prevented.

The present invention is characterized as the most main feature in that a grounding pattern is formed in an output transformer mounting location of a circuit board incorporated in a microphone, a conductive fabric is put on the grounding pattern, a core of the output transformer is stacked and arranged on the conductive fabric, and the core of the output transformer is grounded through the conductive fabric.

In addition to the conductive fabric interposing between the grounding pattern of the circuit board and the core of the output transformer, a second conductive fabric that covers the output transformer and is in contact with an inner circumferential surface of a microphone case may be provided and the microphone case may be grounded by bringing the second conductive fabric into contact with the core of the output transformer.

According to a microphone carrying out the present invention, a core of an output transformer is electrically grounded to a grounding pattern of a circuit board through a conductive fabric so that a microphone with a low level of noise without being affected by external noise can be obtained. Since the conductive fabric is just put on the grounding pattern of the circuit board when incorporating the output transformer and then the core of the output transformer is put on the conductive fabric and fixed, there is no need to solder the core and thus a conventional problem of degradation of magnetic properties by heating of the core can be solved.

The conductive fabric is formed like a fabric by knitting conductive small-gage wires or formed like a non-woven fabric without knitting. Since the conductive fabric has an elastic force also in a thickness direction, it acts on the output transformer as a cushioning material and can advantageously mitigate an impact force applied to the output transformer when the impact force is applied to the microphone.

BRIEF DESCRIPTION OF THE DRAWINGS

FIGS. 1A to 1C show a first embodiment of a microphone according to the present invention, FIG. 1A is a plan view of a circuit board and output transformer portion, FIG. 1B is a front sectional view thereof, and FIG. 1C is a right side view.

FIG. 2A is a plan view of a circuit board and output transformer portion, FIG. 2B is a front sectional view of the circuit board and output transformer portion including a microphone case, and FIG. 2C is a right side view.

FIG. 3A is a plan view, FIG. 3B is a plan sectional view, and FIG. 3C is a front sectional view.

FIG. 4A is a plan view, FIG. 4B is a front view, and FIG. 4C is a right side view.

FIGS. 5A to 5C show another example of a conventional microphone without showing a microphone case, FIG. 5A is a plan view, FIG. 5B is a front view, and FIG. 5C is a right side view.

DESCRIPTION OF THE PREFERRED EMBODIMENTS

Figure 2A:
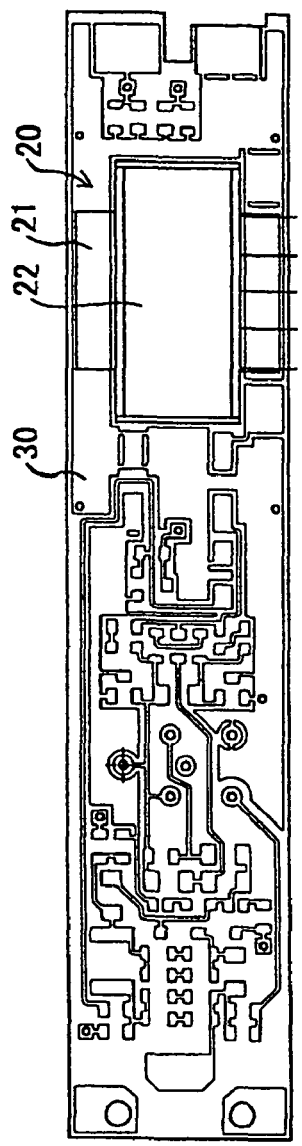
FIGS. 2A to 2C show a second embodiment of a microphone according to the present invention.

Embodiments of a microphone according to the present invention will be described below with reference to drawings. The same reference numerals are attached to the same components as those in the conventional example.

First Embodiment

FIG. 1A, FIG. 1B, and FIG. 1C show the first embodiment of a microphone according to the present invention and show a portion of a circuit board 30 disposed in a microphone case and an output transformer 20 mounted on the circuit board 30. FIG. 1A is a plan view, FIG. 1B is a front view, and FIG. 1C is a right side view.

Figure 4A:
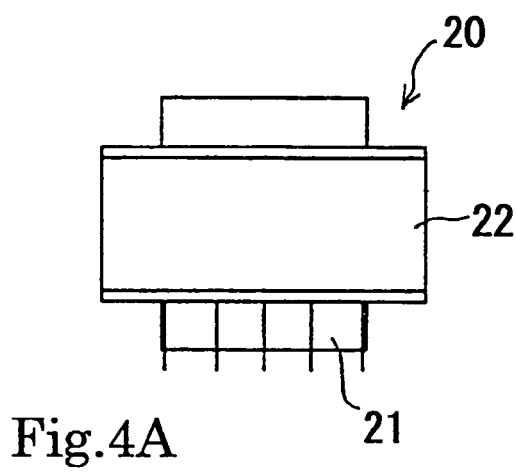
FIGS. 4A to 4C show an example of an output transformer used in a general conventional microphone.
Figure 4B:
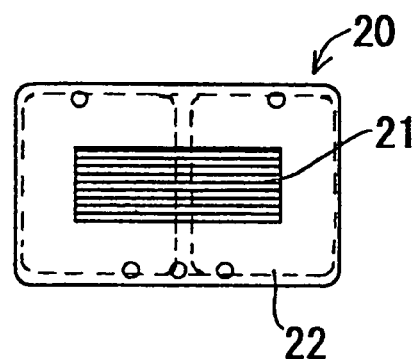
Figure 4C:
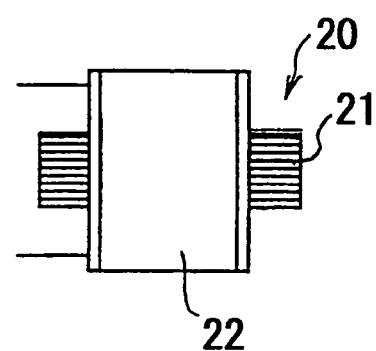
Figure 6:
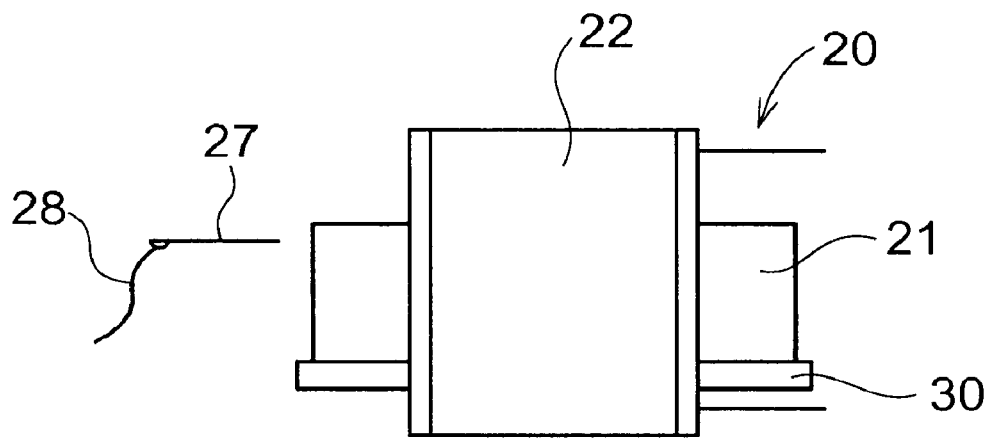
FIG. 6 is a right side view showing an example of still another conventional microphone.

In FIG. 1A, FIG. 1B, and FIG. 1C, the circuit board 30 is incorporated in the microphone case, a microphone unit is disposed next to a left end of FIG. 1A and FIG. 1B, and a connector for connecting with an external circuit is disposed next to a right end. The output transformer 20 is disposed near the right end of the circuit board 30. The output transformer 20, as already described with reference to FIGS. 4A to 4C, has the core 21, which is a laminate of core boards made of high-permeability material such as a permalloy, and the coil 22 wound around the core 21. The coil consists of a primary coil and a secondary coil with a center tap.

Since the output transformer 20 has a form in which the coil 22 is wound around the core 21 of a rectangular frame, both ends of the core 21 project outward from the coil 22 and the coil 22 is in an intermediate portion of the core 21 in a swollen form from the core 21. When mounting the output transformer 20 on the circuit board 30, the core 21 is mounted on the circuit board 30 and care must be taken so that the coil 22 existing in a swollen form from the core 21 should not interfere with the circuit board 30. Thus, a relief hole 31 for the coil 22 is formed on the circuit board 30 so that the coil 22 is dropped into the relief hole 31. The core 21 projecting from both sides of the coil 22, on the other hand, is placed on a side edge of the relief hole 31. The circuit board 30 has grounding patterns formed on the side edge of the relief hole 31 on which the core 21 is put. Thus, both ends of the core 21 of the output transformer 20 are put on the grounding patterns. However, a conductive fabric 24 is put on each of the grounding patterns on which both ends of the core 21 are put, each end of the core 21 is put on each of these conductive fabrics 24, and the core 21 is fixed to the circuit board 30 by appropriate fixing means to fix the output transformer 20.

As the conductive fabrics 24, as described above, a member formed by bending regularly or irregularly conductive metallic small-gage wires like an elastic fabric can be used. Such members include a conductive fabric SUI-78-5010T manufactured by TAIYO WIRE CLOTH CO., LTD. In the embodiments of the present invention, the conductive fabric manufactured by TAIYO WIRE CLOTH CO., LTD. was adopted. Since the conductive fabrics 24 interpose between the grounding patterns of the circuit board 30 and the core 21 of the output transformer 20, the core 21 is grounded and it becomes possible to prevent influences of external noise on the output transformer 20 and prevent mixing of noise to a sound signal resulting from external noise. Since the conductive fabric has an elastic force also in the thickness direction, it acts on the output transformer as a cushioning material and can advantageously mitigate an impact force applied to the output transformer 20 when the impact force is applied to the microphone by, for example, dropping the microphone. Since there is no need for soldering to ground the core 21 of the output transformer 20, there is no degradation of magnetic properties caused by a temperature rise of the core 21. Also, since there is no need for grounding by inserting metal plates between core boards, no stress is applied to the core boards and there is no change in magnetic properties caused by a stress.

Second Embodiment

Figure 2B:
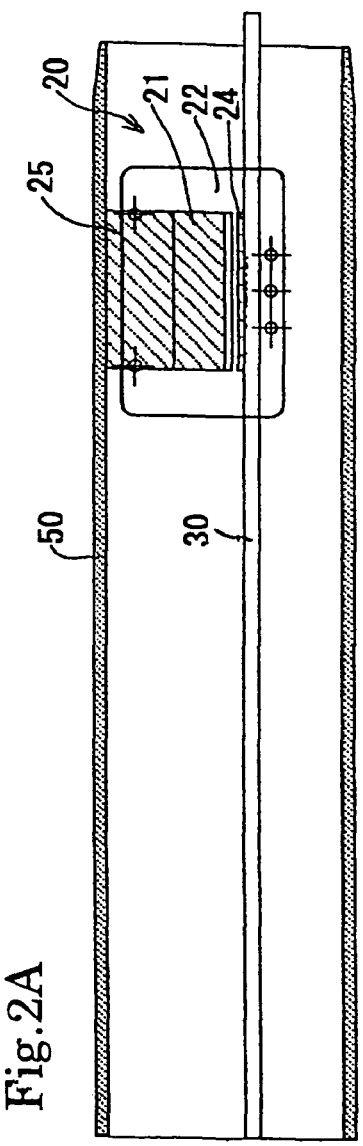
Figure 2C:
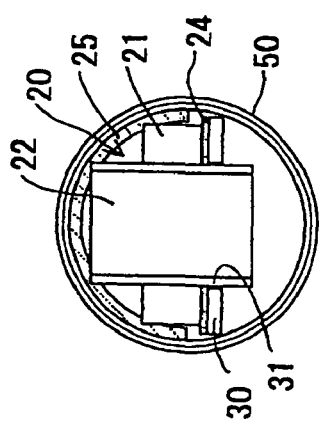
Figure 3A:
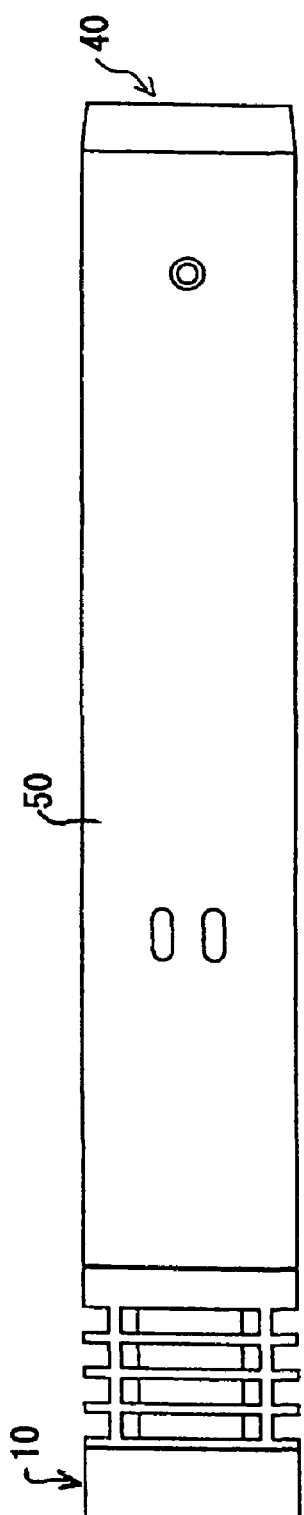
FIGS. 3A to 3C show an example of a general conventional microphone.
Figure 3B:
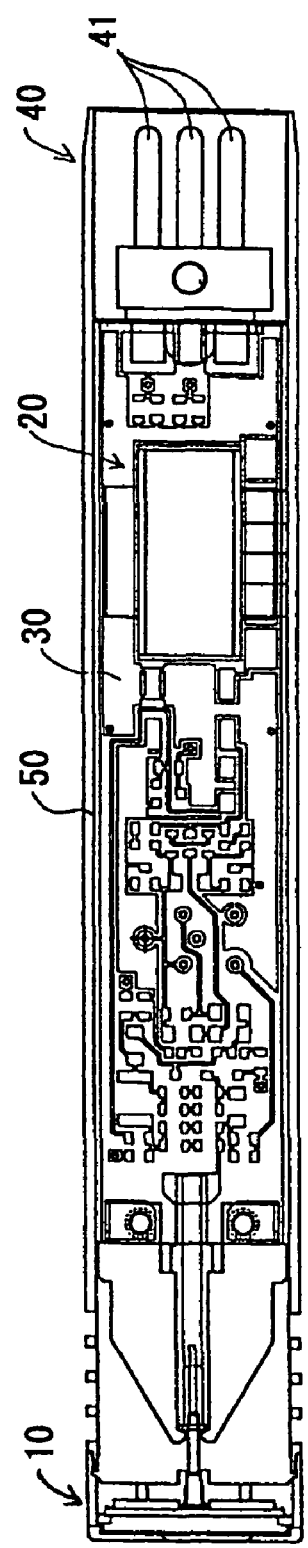
Figure 3C:
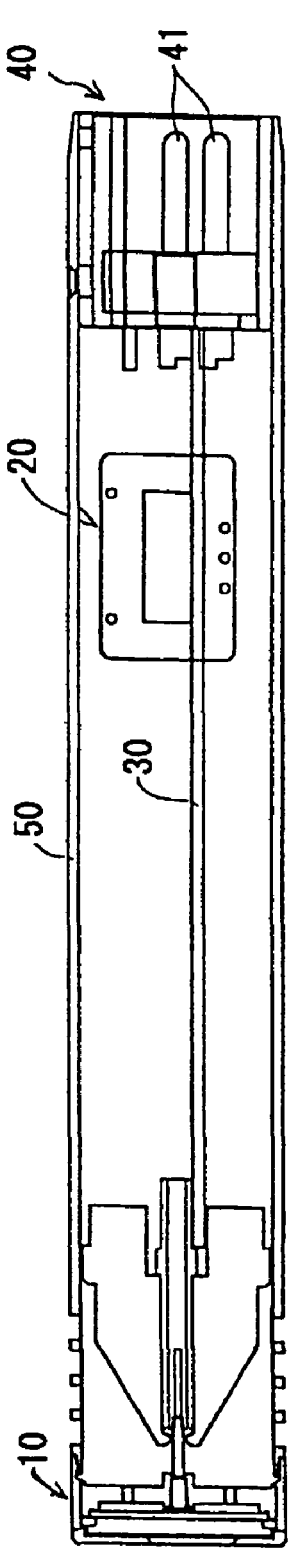

Next, the second embodiment shown in FIG. 2A, FIG. 2B, and FIG. 2C will be described. FIG. 2A is a plan view of the circuit board 30 incorporated in a microphone case, FIG. 2B is a front sectional view of a microphone including the microphone case, and FIG. 2C is a right side view including the microphone case. Like the first embodiment shown in FIG. 1A, FIG. 1B, and FIG. 1C, in the present embodiment, the conductive fabrics 24 are put on grounding patterns of the circuit board 30, and the core 21 of the output transformer 20 is put on the conductive fabrics 24. The coil 22 of the output transformer 20 is dropped into the rectangular hole 31 formed on the circuit board 30 and the core 21 projecting from both sides of the coil 22 is put on the circuit board 30 through the conductive fabrics 24, which is similar to the embodiment shown in FIG. 1A, FIG. 1B, and FIG. 1C.

A difference of the second embodiment from the first embodiment lies in having a second conductive fabric 25 that covers the output transformer 20 and is in contact with an inner circumferential surface of a microphone case 50, in addition to the conductive fabrics 24 interposing between the grounding patterns of the circuit board 30 and the core 21 of the output transformer 20. The second conductive fabric 25 has a dimension in a central axis direction almost identical to that of the core 21 of the output transformer 20 in the central axis direction and just enough to cover almost all projecting portions on the circuit board 30 of the output transformer 20.

To place the second conductive fabric 25, an almost upper half of the output transformer 20 is covered with the second conductive fabric 25 to make it semi-cylindrical, and while maintaining this state, the second conductive fabric 25 is inserted together with the circuit board 30 into the microphone case 50. By fixing the circuit board 30 to a predetermined location inside the microphone case 50, the second conductive fabric 25 is brought into close contact with the inner circumferential surface of the microphone case 50 like a semicylinder and an almost upper half of the output transformer 20 is covered. Then, an angular portion of the core 21 of the output transformer 20 digs into the second conductive fabric 25 to press the second conductive fabric 25 against an inner surface of the microphone case 50.

In this way, the second conductive fabric 25 is electrically connected to the core 21 of the output transformer 20. Since the core 21 is grounded, the second conductive fabric 25 is also grounded, producing an identical effect as the output transformer 20 whose perimeter is shielded by the conductive fabric 25. If the microphone case 50 is metallic and treatment of the inner circumferential surface allows conduction, the microphone case 50 is also grounded through the conductive fabric 25, and noise can be reduced more effectively with a noise reducing effect by using the first conductive fabric 24.

What is claimed is:

1. A microphone, wherein a grounding pattern is formed in an output transformer mounting location of a circuit board incorporated in the microphone, a conductive fabric having an elastic force is placed on the grounding pattern, a core of the output transformer is stacked and arranged on the conductive fabric, and the core of the output transformer is grounded through the conductive fabric, and the microphone has, in addition to the conductive fabric interposing between the grounding pattern of the circuit board and the core of the output transformer, a second conductive fabric that covers the output transformer and is in contact with an inner circumferential surface of a microphone case.

2. The microphone according to claim 1, wherein the second conductive fabric is in contact with the core of the output transformer and grounds the microphone case by electrically connecting the core.

* * * * *